United States Patent
Chu et al.

[11] Patent Number: 6,051,505
[45] Date of Patent: Apr. 18, 2000

[54] PLASMA ETCH METHOD FOR FORMING METAL-FLUOROPOLYMER RESIDUE FREE VIAS THROUGH SILICON CONTAINING DIELECTRIC LAYERS

[75] Inventors: Po-Tao Chu; Ming-Chieh Yeh; Fang-Cheng Chen; Ting-Yih Lu, all of Hsin-Chu, Taiwan

[73] Assignee: Taiwan Semiconductor Manufacturing Company, Hsin-Chu, Taiwan

[21] Appl. No.: 09/035,052

[22] Filed: Mar. 5, 1998

[51] Int. Cl.[7] .................... H01L 21/302; H01L 21/461
[52] U.S. Cl. .................... 438/710; 438/714; 216/67
[58] Field of Search .................... 134/1.1, 1.2; 216/67, 216/75, 79, 17, 19; 156/345; 438/710, 719, 714

[56] References Cited

U.S. PATENT DOCUMENTS

| | | | |
|---|---|---|---|
| 4,967,337 | 10/1990 | English et al. | 364/184 |
| 5,174,856 | 12/1992 | Hwang et al. | 156/643 |
| 5,188,980 | 2/1993 | Lai | 437/193 |
| 5,609,775 | 3/1997 | Liu | 216/77 |
| 5,872,061 | 2/1999 | Lee et al. | 438/705 |

*Primary Examiner*—Richard Bueker
*Assistant Examiner*—Alva C Powell
*Attorney, Agent, or Firm*—George O. Saile; Stephen B. Ackerman; Alek P. Szecsy

[57] ABSTRACT

A plasma etch method for forming a patterned silicon containing dielectric layer within a microelectronics fabrication. There is first provided a plasma reactor chamber. There is then fixed within the plasma reactor chamber a microelectronics fabrication. The microelectronics fabrication comprises: (1) a substrate employed within the microelectronics fabrication; (2) a metal layer formed over the substrate; (3) a silicon containing dielectric layer formed upon the metal layer; and (4) a patterned photoresist layer formed upon the silicon containing dielectric layer. There is then etched through use of a plasma etch method at a first plasma reactor chamber pressure while employing the patterned photoresist layer as a photoresist etch mask layer the silicon containing dielectric layer to form a patterned silicon containing dielectric layer while reaching and etching the metal layer to form an etched metal layer. The plasma etch method employs an etchant gas composition comprising a fluorine containing etchant gas. Finally, there is pumped the plasma reactor chamber to a second plasma reactor chamber pressure lower than the first plasma reactor chamber pressure for a time sufficient to attenuate formation of a metal-fluoropolymer residue layer upon the etched metal layer.

15 Claims, 3 Drawing Sheets

PLASMA ETCH METHOD FOR FORMING METAL-FLUOROPOLYMER RESIDUE FREE VIAS THROUGH SILICON CONTAINING DIELECTRIC LAYERS

BACKGROUND OF THE INVENTION

1. Field of the Invention

The present invention relates generally to methods for forming vias through silicon containing dielectric layers within microelectronics fabrications. More particularly, the present invention relates to plasma etch methods for forming residue free vias through silicon containing dielectric layers when accessing metal layers within microelectronics fabrications.

2. Background of the Invention

Microelectronics fabrications are formed from microelectronics substrates over which are formed patterned conductor layers which are separated by dielectric layers. Patterned conductor layers within microelectronics fabrications are typically, although not exclusively, formed of conductor materials such as but not limited to metals, metal alloys, doped polysilicon and polycides (doped polysilicon/metal silicide stacks). Similarly, dielectric layers which separate patterned conductor layers within microelectronics fabrications are typically, although not exclusively, formed of silicon containing dielectric materials such as but not limited to silicon oxide dielectric materials, silicon nitride dielectric materials, silicon oxynitride dielectric materials and composites of silicon oxide dielectric materials, silicon nitride dielectric materials and silicon oxynitride dielectric materials.

In the process of forming microelectronics fabrications from microelectronics substrates, it is common in the art of microelectronics fabrication to: (1) connect patterned conductor layers with microelectronic devices within those microelectronics fabrications through contact vias formed through silicon containing dielectric layers within those microelectronics fabrications; and (2) interconnect patterned conductor layers with other patterned conductor layers within those microelectronics fabrications through interconnection vias also formed through silicon containing dielectric layers within those microelectronics fabrications.

Thus, while contact vias and interconnection vias are commonly and desirably formed through silicon containing dielectric layers within microelectronics fabrications, contact vias and interconnection vias are typically not formed entirely without problems through silicon containing dielectric layers within microelectronics fabrications. In particular, it is known in the art of microelectronics fabrication that contact vias or interconnection vias when formed through plasma etch methods through silicon containing dielectric layers within microelectronics fabrications to access patterned conductor metal contact layers or patterned conductor metal interconnection layers within microelectronics fabrications often have metal-fluoropolymer residue layers formed upon the patterned conductor metal contact layers or patterned conductor metal interconnection layers accessed by the contact vias or the interconnection vias. The metal-fluoropolymer residue layers formed upon the patterned conductor metal contact layers or the patterned conductor metal interconnection layers within the contact vias or the interconnection vias typically derive at least in part from: (1) etchant gas compositions employing fluorine containing etchant gases which are employed when plasma etching vias through silicon containing dielectric layers; along with (2) metal from the patterned conductor metal contact layers or the patterned conductor metal interconnection layers which are accessed and etched within the plasma etch methods when forming and over-etching those contact vias and interconnection vias through the silicon containing dielectric layers.

Metal-fluoropolymer residue layers are undesirable when formed upon patterned conductor metal contact layers or patterned conductor metal interconnection layers within contact vias or interconnection vias through silicon containing dielectric layers within microelectronics fabrications since it is typically difficult to subsequently form within contact vias or interconnection vias having metal-fluoropolymer residues layers formed therein conductor contact stud layers or conductor interconnection stud layers with desirably low and reproducible contact resistances. It is thus towards the goal of forming within microelectronics fabrications, through plasma etch methods, contact vias and interconnection vias through silicon containing dielectric layers to access patterned conductor metal contact layers and patterned conductor metal interconnection layers without forming metal-fluoropolymer residue layers upon patterned conductor metal contact layers and the patterned conductor metal interconnection layers accessed through those contact vias and interconnection vias that the present invention is more specifically directed.

Various novel plasma etch methods have been disclosed in the art of microelectronics fabrication for forming patterned layers within microelectronics fabrications.

For example, Hwang et al., in U.S. Pat. No. 5,174,856, discloses a plasma etch stripping method for removing from a chlorine containing plasma etched patterned metal layer within an integrated circuit microelectronics fabrication a photoresist etch mask layer employed in defining the chlorine containing plasma etched patterned metal layer. The plasma stripping method employs an oxygen containing stripping gas composition followed by an oxygen and ammonia containing stripping gas composition to strip from the chlorine containing plasma etched patterned metal layer the patterned photoresist etch mask layer while providing the chlorine containing plasma etched patterned metal layer which is inhibited from chlorine containing plasma residue corrosion for a minimum of 24 hours.

In addition, Lai, in U.S. Pat. No. 5,188,980, discloses a plasma etch method for forming within an integrated circuit microelectronics fabrication a polycide gate structure while avoiding undercutting of a metal silicide layer within the polycide gate structure. The method employs a first chlorine and helium etchant gas composition when plasma etching the metal silicide layer within the polycide gate structure followed by a helium purge prior to employing a second chlorine and helium etchant gas composition when plasma etching a polysilicon layer within the polycide gate structure.

Finally, Liu, in U.S. Pat. No. 5,609,775, discloses a plasma etch method for forming a composite aluminum upper layer/titanium-tungsten middle layer/titanium lower layer patterned layer within an integrated circuit microelectronics fabrication with: (1) improved etch selectivity of the titanium-tungsten middle layer with respect to a patterned photoresist etch mask layer employed in defining the composite aluminum upper layer/titanium-tungsten middle layer/titanium lower layer patterned layer; and (2) attenuated sidewall taper of the composite aluminum upper layer/titanium-tungsten middle layer/titanium lower layer patterned layer. To provide the improved etch selectivity, the plasma etch method employs a carbon tetrafluoride etchant gas within the etchant gas composition employed in etching the titanium-tungsten middle layer. To provide the attenuated sidewall taper, the plasma etch method employs a nitrogen etching gas within the etchant gas compositions employed in etching each of the layers within the composite aluminum upper layer/titanium-tungsten middle layer/titanium lower layer patterned layer.

Desirable in the art of microelectronics fabrication are plasma etch methods through which may be formed vias through silicon containing dielectric layers to access conductor metal layers without forming metal-fluoropolymer residue layers upon the conductor metal layers accessed through the vias. It is towards those objects that the present invention is generally directed.

SUMMARY OF THE INVENTION

A first object of the present invention is to provide a plasma etch method for forming within a microelectronics fabrication a via through a silicon containing dielectric layer to access a conductor metal layer.

A second object of the present invention is to provide a method in accord with the first object of the present invention, where there is attenuated formation of a metal-fluoropolymer residue layer upon the conductor metal layer exposed within the via when over-etching the silicon containing dielectric layer to form the via.

A third object of the present invention is to provide a method in accord with the first object of the present invention or the second object of the present invention, where the microelectronics fabrication is an integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided by the present invention a plasma etch method for forming a via through a silicon containing dielectric layer within a microelectronics fabrication. To practice the method of the present invention, there is first provided a plasma reactor chamber. There is then positioned within the plasma reactor chamber a microelectronics fabrication. The microelectronics fabrication comprises: (1) a substrate employed within the microelectronics fabrication; (2) a metal layer formed over the substrate; (3) a silicon containing dielectric layer formed upon the metal layer; and (4) a patterned photoresist layer formed upon the silicon containing dielectric layer. There is then etched through use of a plasma etch method at a first plasma reactor chamber pressure while employing the patterned photoresist layer as a photoresist etch mask layer the silicon containing dielectric layer to form a patterned silicon containing dielectric layer while reaching and etching the metal layer to form an etched metal layer. The plasma etch method employs an etchant gas composition comprising a fluorine containing etchant gas. Finally, there is then pumped the plasma reactor chamber to a second plasma reactor chamber pressure lower than the first plasma reactor chamber pressure for a time sufficient to attenuate formation of a metal-fluoropolymer residue layer upon the etched metal layer.

The present invention provides a plasma etch method for forming within a microelectronics fabrication a via through a silicon containing dielectric layer to access a conductor metal layer while attenuating formation of a metal-fluoropolymer residue layer upon the conductor metal layer exposed within the via when over-etching the silicon containing dielectric layer when forming the via. The method of the present invention realizes the foregoing objects by employing subsequent to forming the via through the silicon containing dielectric layer through the plasma etch method at a first plasma reactor chamber pressure within a plasma reactor chamber a pumping of the plasma reactor chamber to a second plasma reactor chamber pressure lower than the first plasma reactor chamber pressure for a time period sufficient to attenuate formation of a metal-fluoropolymer residue layer upon the surface of an etched conductor metal layer within via. While the mechanism through which the method of the present invention provides vias through silicon containing dielectric layers to access conductor metal layers within microelectronics fabrications while attenuating formation of metal-fluoropolymer residue layers upon those conductor metal layers is not entirely clear, it has nonetheless been experimentally observed that the plasma reactor chamber pumping method of the present invention assists in providing a metal-fluoropolymer residue free via through a silicon containing dielectric layer accessing a conductor metal layer in comparison with a method otherwise equivalent to the method of the present invention but absent the plasma reactor chamber pumping at the second plasma reactor chamber pressure.

The present invention may be employed where the microelectronics fabrication is an integrated circuit microelectronics fabrication. The method of the present invention does not discriminate with respect to the nature of a microelectronics fabrication within which there is formed a via through a silicon containing dielectric layer to access a conductor metal layer through the method of the present invention. Thus, the present invention may be employed in forming vias through silicon containing dielectric layers to access conductor metal layers within microelectronics fabrication including but not limited to integrated circuit microelectronics fabrications, solar cell microelectronics fabrications, ceramic substrate microelectronics fabrications and flat panel display microelectronics fabrications.

The present invention is readily manufacturable. The present invention provides that a via is formed through a silicon containing dielectric layer to access a conductor metal layer within a microelectronics fabrication while attenuating formation of a metal-fluoropolymer residue layer upon the conductor metal layer by employing after a plasma etch method at a first plasma reactor chamber pressure within a plasma reactor chamber when forming the via through the silicon containing dielectric layer a pumping of the plasma reactor chamber at a second plasma reactor chamber pressure lower than the first plasma reactor chamber pressure for a time period sufficient to attenuate formation of the metal-fluoropolymer residue layer. Since methods through which plasma reactor chamber pressures may be adjusted through pumping plasma reactor chambers are generally known in the art of microelectronics fabrication, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a plasma etch method for forming within a microelectronics fabrication a via through a silicon containing dielectric layer to access a conductor metal layer formed beneath the silicon containing dielectric layer, while attenuating formation of a metal-fluoropolymer residue layer upon the conductor metal layer when overetching the silicon containing dielectric layer to form the via through the silicon containing dielectric layer. The method of the present invention realizes the foregoing objects by subsequently to forming the via through the silicon containing dielectric layer through the plasma etch method within a plasma reactor chamber at a first plasma reactor chamber pressure pumping the plasma reactor chamber to a second plasma reactor chamber pressure lower than the first plasma reactor chamber pressure for a time period sufficient to attenuate formation of a metal-fluoropolymer residue layer upon the conductor metal layer accessed by the via formed through the silicon containing dielectric layer. While the mechanism through which the method of the present invention provides a via through a silicon containing dielectric layer to access a conductor metal layer while attenuating formation of a metal-fluoropolymer residue layer upon the conductor metal layer is not entirely clear, it has nonetheless been experimentally observed that the plasma reactor chamber pumping method of the present invention provides a metal-fluoropolymer residue layer free conductor metal layer accessed by a via through a silicon containing dielectric layer, in comparison with a method otherwise equivalent to the method of the present invention, but absent the plasma reactor chamber pumping at the second plasma reactor chamber pressure in accord with the method of the present invention.

The present invention may be employed in forming vias through silicon containing dielectric layers to access conductor metal layers within microelectronics fabrications including but not limited to integrated circuit microelectronics fabrications, solar cell microelectronics fabrications, ceramic substrate microelectronics fabrications and flat panel display microelectronics fabrications. Typically and preferably, the method of the present invention is employed in forming contact vias or interconnection vias through silicon containing dielectric layers to access patterned conductor metal contact layers or patterned conductor metal interconnection layers within integrated circuit microelectronics fabrications.

First Preferred Embodiment

Figure 1:
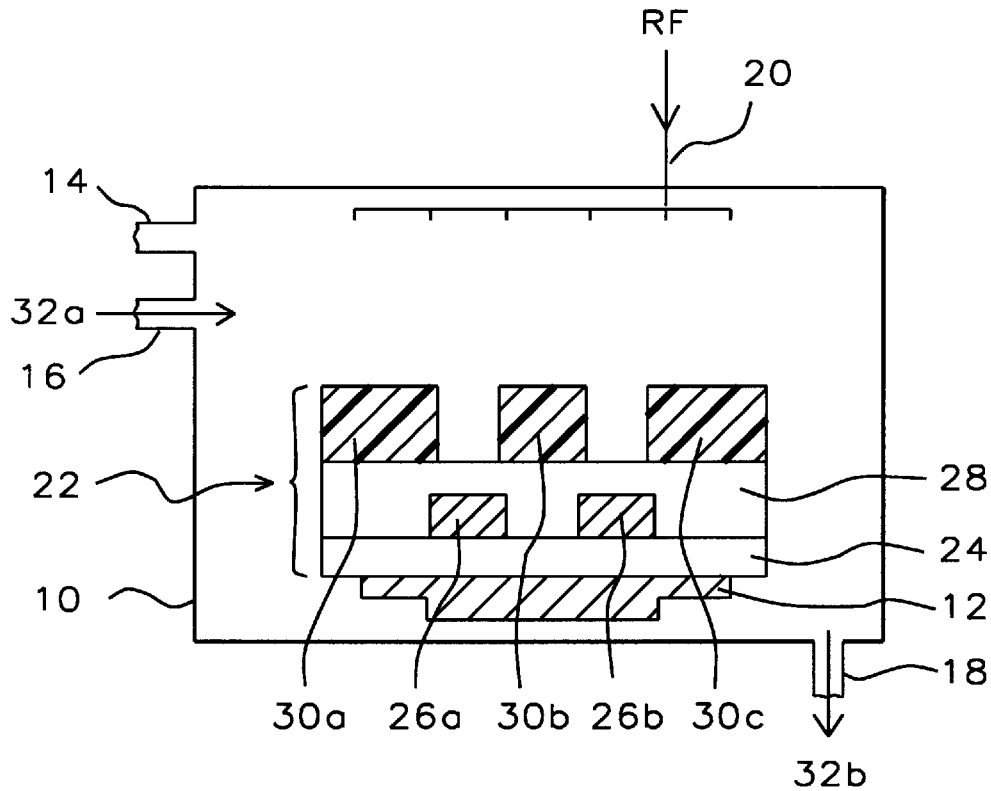
FIG. 1 to FIG. 3 show a series of schematic cross-sectional diagrams illustrating the results of progressive stages in forming through a silicon containing dielectric layer within a microelectronics fabrication in accord with a first preferred embodiment of the present invention a pair of vias accessing a pair of patterned metal layers.
Figure 2:
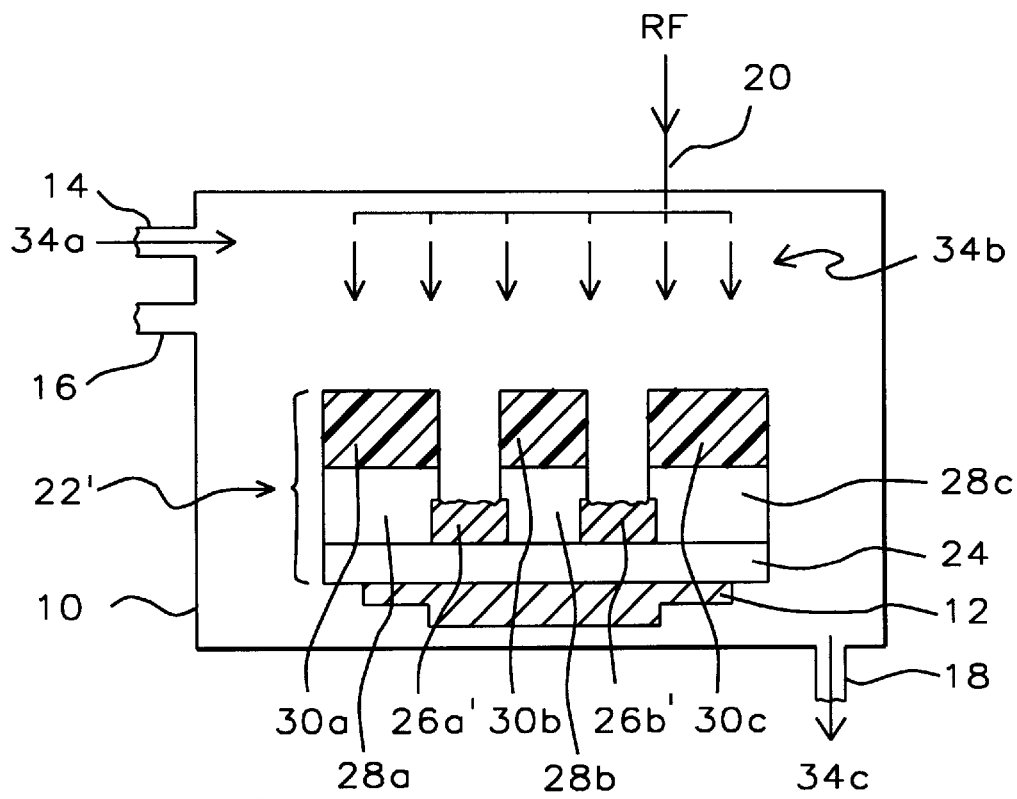
Figure 3:
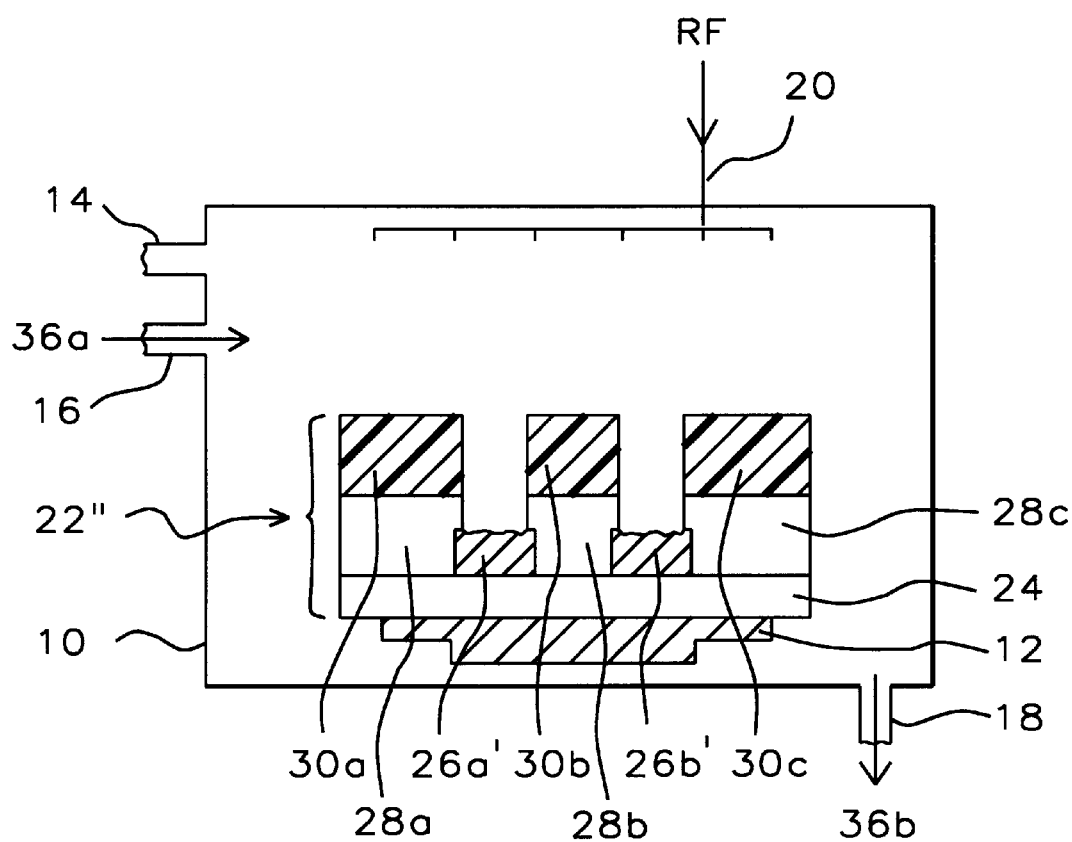

Referring now to FIG. 1 to FIG. 3 there is shown a series of schematic cross-sectional diagrams illustrating the results of forming through a silicon containing dielectric layer within a microelectronics fabrication a pair of vias accessing a pair of patterned metal layers in accord with a first preferred embodiment of the present invention. Shown in FIG. 1 is a schematic cross-sectional diagram, in part, of the microelectronics fabrication at an early stage in its fabrication.

Shown in FIG. 1 is a plasma reactor chamber 10 having fixed therein a platen 12 which in turn has positioned thereupon a microelectronics fabrication 22. The plasma reactor chamber 10 additionally has incorporated therein: (1) a reactant gas entry port 14; (2) a purge gas entry port 16; and (3) an exhaust port 18. Similarly, there is also incorporated within the plasma reactor chamber 10 a radio frequency electrode 20. The plasma reactor chamber 10, and each of the components incorporated therein, are conventional to the art of microelectronics fabrication and sized appropriately to the microelectronics fabrication 22.

With respect to the microelectronics fabrication 22, the microelectronics fabrication 22 comprises a substrate 24 upon which is formed a pair of patterned conductor metal layers 26a and 26b. In addition, there is in turn formed over the substrate 24 and upon the pair of patterned conductor metal layers 26a and 26c a blanket silicon containing dielectric layer 28. Finally, there is formed upon the blanket silicon containing dielectric layer 28 a series of patterned photoresist layers 30a, 30b and 30c. Each of the foregoing substrate or layers may be formed through methods and materials as are conventional in the art of microelectronics fabrication.

For example, the substrate 24 may be a substrate employed within a microelectronics fabrication including but not limited to an integrated circuit microelectronics fabrication, a solar cell microelectronics fabrication, a ceramic substrate microelectronics fabrication or a flat panel display microelectronics fabrication. Although not specifically illustrated by the schematic cross-sectional diagram of FIG. 1, the substrate 24, particularly when a semiconductor substrate employed within an integrated circuit microelectronics fabrication which is most preferred within the method of the present invention, may have formed therein or there upon microelectronics devices. Similarly, although FIG. 1 illustrates the substrate 24 as a single layer, the substrate 24 as illustrated in FIG. 1 is intended to include a substrate itself as employed within a microelectronics fabrication, as well as the substrate employed within the microelectronics fabrication, where the substrate has formed thereupon and/or thereover additional microelectronics layers as are conventionally employed within the microelectronics fabrication. Such additional layers may include, but are not limited to, microelectronics conductor layers, microelectronics semiconductor layers and microelectronics dielectric layers.

With respect to the pair of patterned conductor metal layers 26a and 26b, methods and materials through which patterned conductor metal layers may be formed within microelectronics layers typically include, but are not limited to, thermally assisted evaporation methods, electron beam assisted evaporation methods, chemical vapor deposition (CVD) methods and physical vapor deposition (PVD) sputtering methods, along with photolithographic patterning methods, through which are formed patterned conductor metal layers of metals including but not limited to: (1) aluminum containing metals such as but not limited to aluminum and aluminum alloys; (2) titanium containing metals such as but not limited to titanium and titanium alloys; and (3) copper containing metals such as but not limited to copper and copper alloys. For the first preferred embodiment of the present invention, the pair of patterned conductor metal layers 26a and 26b is preferably formed from an aluminum containing metal formed to a thickness of about 3000 to about 10000 angstroms contacting the substrate 24, where the pair of aluminum containing patterned conductor metal layers has a pair of corresponding patterned titanium nitride layers of thickness about 200 to about 2000 angstroms formed and aligned thereupon.

With respect to the blanket silicon containing dielectric layer 28, it is also known in the art of microelectronics fabrication that blanket silicon containing dielectric layers may be formed through methods and materials including but not limited to chemical vapor deposition (CVD) methods, plasma enhanced chemical vapor deposition (PECVD) methods and physical vapor deposition (PVD) sputtering methods through which may be formed blanket silicon containing dielectric layers of silicon containing dielectric materials including but not limited to silicon oxide dielectric materials, silicon nitride dielectric materials, silicon oxynitride dielectric materials and composites of silicon oxide dielectric materials, silicon nitride dielectric materials and silicon oxynitride dielectric materials. For the first preferred embodiment of the present invention, the blanket silicon containing dielectric layer 28 is preferably formed of a silicon oxide dielectric material deposited through a plasma enhanced chemical vapor deposition (PECVD) method, although other methods and materials may also be employed when forming the blanket silicon containing dielectric layer 28. Preferably, the blanket silicon containing dielectric layer 28 so formed is formed to a thickness of from about 2000 to about 20000 angstroms.

With respect to the series of patterned photoresist layers 30a, 30b and 30c, it is also known in the art of microelectronics fabrication that patterned photoresist layers may be formed from any of several photoresist materials as are known in the art of microelectronics fabrication, including but not limited to photoresist materials chosen from the general groups of photoresist material including but not limited to positive photoresist materials and negative photoresist materials. For the first preferred embodiment of the present invention, the series of patterned photoresist layers 30a, 30b and 30c may be formed from any of several photoresist materials, including positive photoresist materials or negative photoresist materials, preferably to a thickness of from about 10000 to about 15000 angstroms each upon the blanket silicon containing dielectric layer 28. Preferably, the series of patterned photoresist layers 30a, 30b and 30c defines a pair of apertures of width about 0.1 to about 1.0 microns exposing the surface of the blanket silicon containing dielectric layer 28.

Finally, there is shown within FIG. 1: (1) a first purge gas flow 32a entering the purge gas entry port 16 of the plasma reactor chamber 10; and (2) a corresponding spent first purge gas flow 32b exiting the exhaust port 18 of the plasma reactor chamber 10. Although the use of the first purge gas flow 32a is optional within the method of the present invention, the use of the first purge gas flow 32a assists in providing a more consistent and uniform manufacturing process when fabricating vias through silicon containing dielectric layers within microelectronics fabrications through the method of the present invention. Preferably, the first purge gas flow 32a employs an inert purge gas, such as but not limited to nitrogen, argon or helium, at a flow rate of from about 50 to about 1000 standard cubic centimeters per minute (sccm).

Referring now to FIG. 2 there is shown a schematic cross-sectional diagram illustrating the results of further processing of the microelectronics fabrication 22 within the plasma reactor chamber 10 whose schematic cross-sectional diagram is illustrated in FIG. 1. Shown in FIG. 2 is a schematic cross-sectional diagram of a microelectronics fabrication within a plasma reactor chamber otherwise equivalent to the microelectronics fabrication 22 within the plasma reactor chamber 10 as illustrated in FIG. 1, but wherein the blanket silicon containing dielectric layer 28 within the microelectronics fabrication 22 as illustrated in FIG. 1 has been etched within an etching plasma 34b to form a pair of vias accessing a pair of etched patterned conductor metal layers 26a' and 26b'. The pair of vias so formed is defined by a series of patterned silicon containing dielectric layers 28a, 28b and 28c. The etching plasma 34b is formed through radio frequency plasma activation of a plasma etching gas composition flow 34a introduced into the plasma reactor chamber 10 through the reactant gas entry port 14 and exhausted from the plasma reactor chamber 10 through the exhaust port 18 as a spent plasma etching gas composition flow 34c. As is illustrated within the schematic cross-sectional diagram of FIG. 2, the substrate 24, the etched patterned conductor metal layers 26a' and 26b', the patterned silicon containing dielectric layers 28a, 28b and 28c and the patterned photoresist layers 30a, 30b and 30c in the aggregate form an etched microelectronics fabrication 22'.

Within the first preferred embodiment of the present invention, the plasma etching gas composition flow 34a preferably comprises at least one fluorine containing etchant gas, as is understood by a person skilled in the art to typically be employed when plasma etching a silicon containing dielectric layer. Appropriate fluorine containing etchant gases may include, but are not limited to, perfluorocarbons, hydrofluorocarbons, sulfur hexafluoride and nitrogen trifluoride. More preferably, the plasma etching gas composition flow 34a comprises a carbon tetrafluoride fluorine containing etchant gas, a trifluoromethane fluorine containing etchant gas and an argon sputtering gas. Within the first preferred embodiment of the present invention, the etching plasma 34b also preferably employs: (1) a reactor chamber pressure of greater than 0.1 to about 0.5 torr; (2) a radio frequency power of from about 400 to about 1000 watts at a radio frequency of 400 kHz; (3) a substrate 24 temperature of from about −10 to about 10 degrees centigrade; (4) a carbon tetrafluoride flow rate of from about 5 to about 100 standard cubic centimeters per minute (sccm); (5) a trifluoromethane flow rate of from about 5 to about 100 standard cubic centimeters per minute (sccm); and (6) an argon sputtering gas flow of from about 50 to about 800 standard cubic centimeters per minute (sccm).

Within the first preferred embodiment of the present invention, the blanket silicon containing dielectric layer 28 is etched within the etching plasma 34b to form the series of patterned silicon containing dielectric layers 28a, 28b and 28c which define the pair of vias accessing the pair of etched patterned conductor metal layers 26a' and 26b' for a period of time sufficient to reach and etch the pair of etched patterned conductor metal layers 26a' and 26b', plus about 10 to about 200 seconds over-etch of the patterned silicon containing dielectric layers 28a, 28b and 28c. In absence of the method of the present invention, and in particular in absence of the method of the present invention when it is desired to form a particularly dense array of vias through a silicon containing dielectric layer accessing patterned conductor metal layers within a microelectronics fabrication, there is typically formed upon the series of patterned metal layers accessed by the vias, such as the pair of etched patterned metal layers 26a' and 26b' accessed by the pair of vias defined by the series of patterned silicon containing dielectric layers 28a, 28b and 28c as illustrated within the schematic cross-sectional diagram of FIG. 2, a corresponding series of metal-fluoropolymer residue layers which impedes subsequently forming within those vias conductor stud layers with desirably low and reproducible contact resistances.

Referring now to FIG. 3, there is shown a schematic cross-sectional diagram illustrating the results of further processing of the etched microelectronics fabrication 22' within the plasma reactor chamber 10 whose schematic cross-sectional diagram is illustrated in FIG. 2. Shown in FIG. 3 is a schematic cross-sectional diagram of an etched microelectronics fabrication otherwise equivalent to the etched microelectronics fabrication 22' within the plasma reactor chamber 10 as illustrated within FIG. 2, but wherein the etched microelectronics fabrication 22' has been purged to form a purged etched microelectronics fabrication 22". Within the first preferred embodiment of the method of the present invention, the etched microelectronics fabrication 22' as illustrated in FIG. 2 is in part purged to form the purged etched microelectronics fabrication 22" as illustrated in FIG. 3 through use of a second purge gas flow 36a introduced into the plasma reactor chamber 10 through the purge gas entry port 16 and subsequently exhausted as a spent second purge gas flow 36b through the exhaust port 18.

Within the first preferred embodiment of the present invention, in conjunction with employing the second purge gas flow 36a in part to form from the etched microelectronics fabrication 22' as illustrated in FIG. 2 the purged etched microelectronics fabrication 22" as illustrated in FIG. 3, the plasma reactor chamber 10 is pumped to a second plasma reactor chamber pressure lower than the first plasma reactor chamber pressure employed when etching the microelectronics fabrication 22 as illustrated in FIG. 1 to form the etched microelectronics fabrication 22' as illustrated in FIG. 2. The plasma reactor chamber 10 is pumped to the second plasma reactor chamber pressure for a time period sufficient to attenuate formation of metal-fluoropolymer residue layers which would otherwise form upon the etched patterned conductor metal layers 26a' and 26b'. Within the first preferred embodiment of the present invention, where the first plasma reactor chamber pressure employed when forming from the microelectronics fabrication 22 as illustrated in FIG. 1 the etched microelectronics fabrication 22' as illustrated in FIG. 2 is generally greater than 0.1 torr and preferably greater than 0.1 to about 0.5 torr, the second plasma reactor chamber pressure employed in part in forming from the etched microelectronics fabrication 22' whose schematic cross-sectional diagram is illustrated in FIG. 2 the purged etched microelectronics fabrication 22" whose schematic cross-sectional diagram is illustrated in FIG. 3 is generally no greater than 0.1 torr, preferably from about 0.0001 torr to no greater than 0.1 torr and more preferably from about 0.005 to about 0.02 torr. Preferably, plasma reactor chamber 10 is maintained at the second plasma reactor chamber pressure of generally no greater than 0.1 torr for a time period of greater than about 10 seconds, more preferably from about 10 to about 200 seconds and most preferably from about 30 to about 100 seconds.

While the mechanism through which the method of the present invention operates to provide a purged etched microelectronics fabrication, such as the purged etched microelectronics fabrication 22", with attenuated metal-fluoropolymer residue layer formation upon etched patterned conductor metal layers, such as the etched patterned conductor metal layers 26a' and 26b', accessed by vias formed through a silicon containing dielectric layers is not well understood, it has been experimentally observed that the second plasma reactor chamber pressure pumpdown process step employed within the method of the present invention after forming an etched microelectronics fabrication provides when subsequently purged with a second purge gas flow a purged etched microelectronics fabrication with attenuated metal-fluoropolymer residue formation upon conductor metal layers accessed through vias formed through the silicon containing dielectric layers.

Subsequent to the second plasma reactor chamber pressure pumpdown process step, the etched microelectronics fabrication 22' as illustrated in FIG. 2 is purged with the second purge gas flow 36a introduced into the plasma reactor chamber as illustrated in FIG. 3 through the purge gas entry port 16 and exhausted as the spent second purge gas flow 36b through the exhaust port 18. Similarly with the first purge gas flow 32a, the second purge gas flow 36a is preferably a nitrogen purge gas flow, although other non-reactive purge gas flows, such as but not limited to argon and helium purge gas flows, may also be employed within the method of the present invention. Preferably, the second purge gas flow 36a is from about 10 to about 1000 standard cubic centimeters per minute (sccm).

Second Preferred Embodiment

In addition to the first preferred embodiment of the present invention, there also exists a second preferred embodiment of the present invention. A schematic cross-sectional diagram illustrating, in general, the features of the second preferred embodiment of the present invention is illustrated in FIG. 4.

Figure 4:
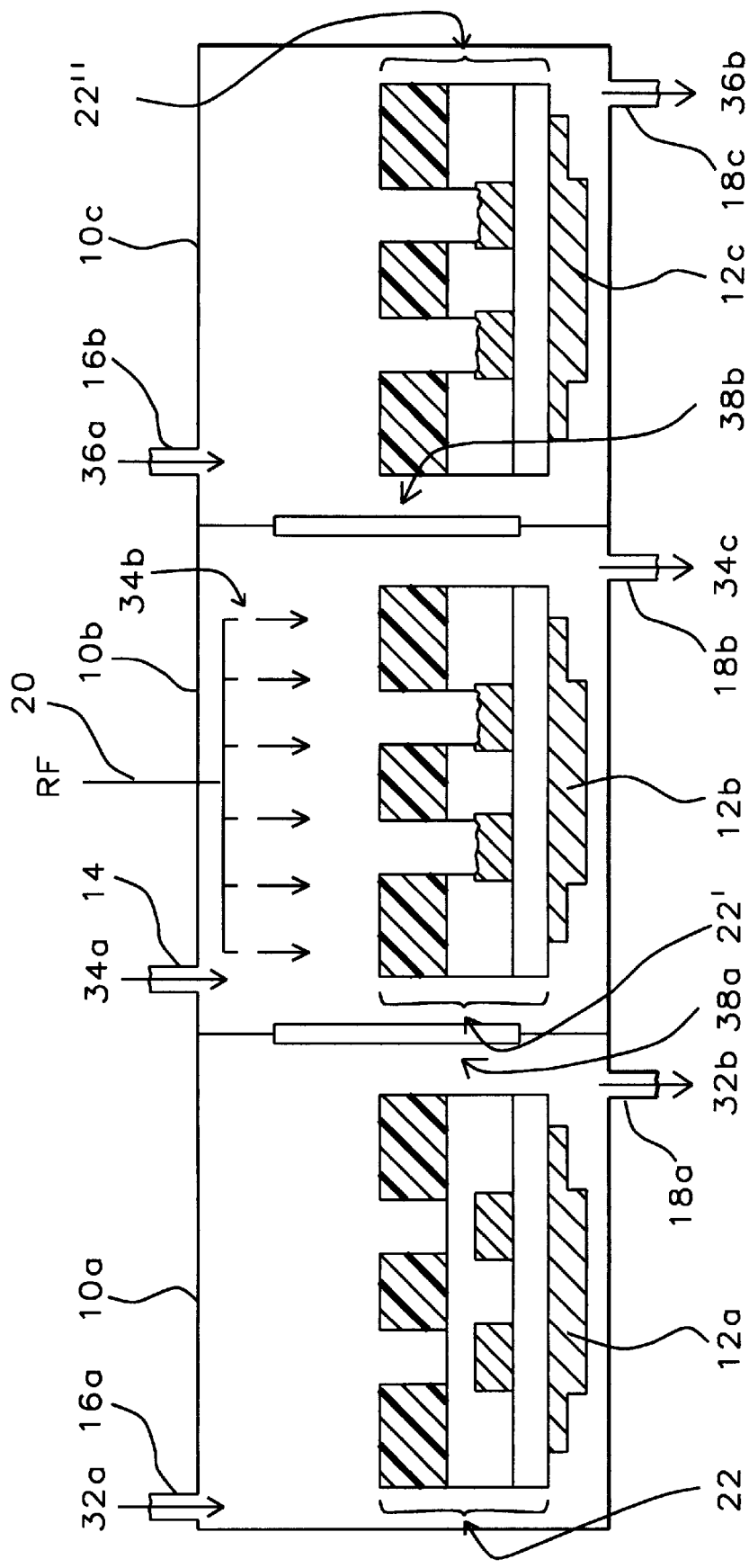
FIG. 4 shows a schematic cross-sectional diagram illustrating the results of progressive stages in forming through a silicon containing dielectric layer with in a microelectronics fabrication in accord with a second preferred embodiment of the present invention a pair of vias accessing a pair of patterned metal layers.

Shown in FIG. 4 is a schematic cross-sectional diagram illustrating, in general, the features of the first preferred embodiment of the present invention, but wherein rather than employing a single plasma reactor chamber 10 as illustrated in FIG. 1 to FIG. 3, there is employed within the second preferred embodiment of the present invention a main plasma reactor chamber 10b having integral thereto: (1) an entrance load lock 10a contiguous with the main plasma reactor chamber 10b and accessed through an entrance load lock window 38a; and (3) an exit load lock 10c contiguous with the main plasma reactor chamber 10b and accessed through an exit load lock window 38b.

Within the second preferred embodiment of the present invention, the entrance load lock 10a has a first platen 12a fixed therein upon which in turn is positioned the microelectronics fabrication 22. The entrance load lock 10a also has the first purge gas flow 32a entering the entrance load lock 10a through a first purge gas entry port 16a and exiting as the spent first purge gas flow 32b through a first exhaust port 18a.

Within the second preferred embodiment of the present invention, the main plasma reactor chamber 10b has a second platen 12b fixed therein in turn having positioned thereupon the etched microelectronics fabrication 22' which is formed through etching the microelectronics fabrication 22 at a first plasma reactor chamber pressure within the etching plasma 34b derived from the plasma etching gas composition flow 34a which enters the main plasma reactor chamber 10b through the reactant gas entry port 14 and exits as spent plasma etching gas composition flow 34c through a second exhaust port 18b.

Finally, within the second preferred embodiment of the present invention, the exit load lock 10c has fixed therein a third platen 12c upon which in turn is positioned the purged etched microelectronics fabrication 22", which is formed from the etched microelectronics fabrication 22' after being subjected to a second plasma reactor chamber pressure pumpdown and purge process cycle in accord with the first preferred embodiment of the present invention. Within the second preferred embodiment of the present invention, the second purge gas flow 36a enters the exit load lock 10c through a second purge gas entry port 16b and exits the exit load lock 10c as spent second purge gas 36b through a third exhaust port 18c.

Within the second preferred embodiment of the present invention the second plasma reactor chamber pressure pumpdown and purge process cycle through which the purged etched microelectronics fabrication 22" is formed from the etched microelectronics fabrication 22' is undertaken within the exit load lock 10c. As is understood by a person skilled in the art, when the second plasma reactor chamber pressure pumpdown and purge process cycle is undertaken within the exit load lock 10c, there is realized substantial manufacturing efficiency when forming the purged etched microelectronics fabrication 22" through the second preferred embodiment of the present invention, in comparison with the first preferred embodiment of the present invention.

EXAMPLES

In order to illustrate the value of the method of the present invention in attenuating metal-fluoropolymer residue layer formation upon metal layers when forming vias through silicon containing dielectric layers accessing those metal layers, there was fabricated a series of twelve semiconductor substrate wafers to serve as a series of test wafers for evaluating metal-fluoropolymer layer density as a function of via plasma etch method and photoresist etch mask stripping method when forming vias through a silicon containing dielectric layer to access a conductor metal layer.

Upon each of the twelve semiconductor substrate wafers was formed a blanket titanium nitride layer of thickness about 3000 angstroms through a chemical vapor deposition (CVD) method as is conventional in the art of integrated circuit microelectronics fabrication. Upon each blanket titanium nitride layer in turn was formed a silicon oxide dielectric layer of thickness about 5000 angstroms through a plasma enhanced chemical vapor deposition (PECVD) method employing silane as a silicon source material. Finally, upon each silicon oxide dielectric layer wa s formed a patterned photoresist layer of thickness about 15000 angstroms from a positive photoresist material. Each patterned photoresist layer defined a bidirectional array of circular apertures of width about 0.5 microns separated by a pitch of about 0.5 microns.

Each of the semiconductor substrate wafers was then sequentially subjected to a plasma via etch method and a patterned photoresist stripping method either conventional in the art of integrated circuit microelectronics fabrication, or a variation thereupon. The conventional plasma via etch method employed: (1) a first plasma reactor chamber pressure of about 0.3 torr; (2) a radio frequency power of about 700 watts at a radio frequency of 400 kHz; (3) a semiconductor substrate temperature of about 0 degrees centigrade; (4) a carbon tetrafluoride flow rate of about 50 standard cubic centimeters per minute (sccm); (5) a trifluoromethane flow rate of about 50 standard cubic centimeters per minute (sccm); and (6) an argon flow rate of about 400 standard cubic centimeters per minute (sccm). The conventional plasma via etch method was employed for a main etch time of about 85 seconds followed by an over-etch time of about 40 seconds followed by a pump down process step to a second plasma reactor chamber pressure of about 0.01 torr for a time period of about 7 seconds.

The conventional photoresist stripping method employed an NMP (N-methylpyrrolidone) photoresist wet strip at a temperature of about 25 degrees centigrade for a time period of about 300 seconds. The NMP photoresist wet strip was followed by an oxygen plasma cleaning at: (1) an oxygen plasma reactor chamber pressure of about 0.8 torr; (2) an oxygen plasma power of about 800 watts; (3) a semiconductor substrate temperature of about 80 degrees centigrade; and (4) an oxygen flow rate of about 500 standard cubic centimeters per minute (sccm), for a time period of about 3000 seconds. The oxygen plasma cleaning was followed by a deionized water rinse for a time period of about 300 seconds.

A first semiconductor substrate wafer within the group of twelve semiconductor wafers received the standard via plasma etch method and the standard photoresist stripping method.

A second semiconductor substrate wafer within the group of twelve semiconductor substrate wafers received the standard via plasma etch method and a otherwise standard photoresist stripping method, but with twice the NMP exposure time.

A third semiconductor substrate wafer within the group of twelve semiconductor substrate wafers received the standard via plasma etch method and an otherwise standard photoresist stripping method but with an oxide etch wet chemical strip in place of the NMP wet chemical strip.

A fourth semiconductor substrate wafer within the group of twelve semiconductor substrate wafers received the standard via plasma etch method and a photoresist stripping method otherwise equivalent to the photoresist stripping method employed for the third semiconductor substrate wafer, but with twice the oxide etch wet chemical stripping exposure time.

A fifth semiconductor substrate wafer within the group of twelve semiconductor substrate wafers received the standard via plasma etch method and an otherwise standard photoresist stripping method, but with the NMP wet chemical strip and the oxygen plasma strip in reversed sequence ordering.

A sixth semiconductor substrate wafer within the group of twelve semiconductor substrate wafers received the standard via plasma etch method and a photoresist stripping method otherwise equivalent to the photoresist stripping method employed for the fifth semiconductor substrate wafer, but at a higher oxygen plasma strip power of about 1600 watts.

A seventh semiconductor substrate wafer within the group of twelve semiconductor substrate wafers received the standard via plasma etch method and the standard photoresist stripping method having interposed therebetween a plasma soft etch employing a carbon tetrafluoride etchant gas at a reactor chamber pressure of about 0.8 torr and a radio frequency power of about 75 watts.

An eighth semiconductor substrate wafer within the group of twelve semiconductor substrate wafers received the standard photoresist stripping method preceded by an otherwise standard via plasma etch method but with a 30 second pump down at a pressure of about 0.01 torr intervening the main etch and the over-etch.

A ninth semiconductor substrate wafer within the group of twelve semiconductor substrate wafers received the standard photoresist stripping method preceded by an otherwise standard via plasma etch method but with a 30 second pump down to a pressure of about 0.01 torr subsequent to the over-etch rather than the seven second pump down at the pressure of about 0.01 torr.

A tenth semiconductor substrate wafer within the group of twelve semiconductor substrate wafers received the standard via plasma etch method and the standard photoresist stripping method having interposed therebetween an additional 90 second pump down to a pressure of about 0.01 torr within an exit load lock of the plasma reactor chamber.

An eleventh semiconductor substrate wafer within the group of twelve semiconductor substrate wafers received the standard via plasma etch method and the standard photoresist stripping method having interposed therebetween an oxygen plasma stripping method employing an apparatus commercially available from International Plasma Corporation at a comparatively low reactor chamber pressure of about 0.01 torr and a comparatively high temperature of about 250 degrees centigrade, for a time period of about 120 seconds.

The twelfth semiconductor substrate wafer within the group of twelve semiconductor substrate wafers received the via plasma etch method and the photoresist stripping method otherwise equivalent to the eleventh semiconductor substrate wafer, but with a 30 second pump down at a pressure of about 0.01 torr after the over-etch rather than the seven second pump down at the pressure of about 0.01 torr after the over-etch.

The series of vias within each of the twelve semiconductor substrate wafers was then visually inspected with an optical microscope at a magnification of about 1000× to ascertain the level of metal-fluoropolymer residue remaining within each of the series of vias. The levels of metal-fluoropolymer residues within the vias were quantified into five groups ranging from no visually perceptible metal-fluoropolymer residue (number 1) to substantial visually perceptible metal-fluoropolymer residue within each via (number 5).

The results of the metal-fluoropolymer residue optical microscopic quantification as a function via plasma etch method and photoresist strip method are shown in Table I.

TABLE I

| Expl. | Via Plasma Etch Method | Photoresist Strip Method | Via Residue |
|---|---|---|---|
| 1 | std = M/E + O/E + 7 sec pump | std = NMP + O2 plasma + DI | 5 |
| 2 | std | 2 NMP + O2 plasma + DI | 5 |
| 3 | std | oxide etch + O2 plasma + DI | 4 |
| 4 | std | 2 oxide etch + O2 plasma + DI | 4 |
| 5 | std | O2 plasma + NMP + DI | 4 |
| 6 | std | O2 plasma (hi power) + NMP + DI | 5 |
| 7 | std + CF4 soft etch | std | 3 |
| 8 | M/E + 30 sec pump + O/E + 7 sec pump | std | 5 |
| 9 | M/E + O/E + 30 sec pump | std | 1 |
| 10 | std + 90 sec exit load lock pump | std | 1 |
| 11 | std + O2 plasma (low press) | std | 5 |
| 12 | M/E + O/E + 30 sec pump + O2 plasma (low press) | std | 5 |

As is seen from review of the data in Table I, in particular with respect to example 9 and example 10, a plasma reactor chamber pump down at a second plasma reactor chamber pressure of about 0.0 1 torr for at least about 30 seconds following a standard via plasma etch provides a series of vias within which there is observed minimal metal-fluoropolymer residue layer formation in comparison with any of the remaining examples which are derived from the standard via plasma etch method and the standard photoresist strip method.

In order to further evaluate the extent to which the method of the present invention provides vias through silicon containing dielectric layers through which there may be formed conductive stud layers with desirably low and reproducible contact resistances, the via plasma etch method and photoresist strip method as outlined within example 1, example 9 and example 10, as above, were employed when forming vias within a series of via test structures through a series of silicon oxide dielectric layers within a series of semiconductor substrates. The series of vias was subsequently filled with tungsten metallization conductor stud layers and the via chain resistances were subsequently determined through methods as are conventional in the art of integrated circuit microelectronics fabrication. The measured values of the via chain resistances, in units of ohms, are reported in Table II.

TABLE II

| Example | Via Etch Process | Photoresist Strip Process | Via Resistance |
|---|---|---|---|
| 1 | std | std | 1.16 +/- 0.12 |
| 9 | M/E + O/E + 30 sec pump | std | 1.14 +/- 0.07 |
| 10 | std + 90 sec exit load lock pump | std | 1.06 +/- 0.04 |

As is seen from review of the data in Table II, a post standard via plasma etch 90 second pump down at a second plasma reactor chamber pressure in accord with the preferred embodiments of the present invention provides a via chain test structure with a desirably lower and more reproducible resistance than an otherwise equivalent via chain test structure formed in absence of the present invention.

What is claimed is:

1. A plasma etch method for forming a via through a silicon containing dielectric layer within a microelectronics fabrication comprising:

providing a plasma reactor chamber;

positioning within the plasma reactor chamber a microelectronics fabrication, the microelectronics fabrication comprising:
   a substrate employed within the microelectronics fabrication;
   a metal layer formed over the substrate;
   a silicon containing dielectric layer formed upon the metal layer; and
   a patterned photoresist layer formed upon the silicon containing dielectric layer;

etching through use of a plasma etch method at a first plasma reactor chamber pressure while employing the patterned photoresist layer as a photoresist etch mask layer the silicon containing dielectric layer to form a via through the silicon containing dielectric layer while reaching and etching the metal layer to form an etched metal layer, the plasma etch method employing an etchant gas composition comprising a fluorine containing etchant gas; and pumping the plasma reactor chamber to a second plasma reactor chamber pressure lower than the first plasma reactor chamber pressure for a time sufficient to attenuate formation of a metal-fluoropolymer residue layer upon the etched metal layer.

2. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

3. The method of claim 1 wherein the metal layer is chosen from the group of metal layers consisting of aluminum containing metal layers, titanium containing metal layers and copper containing metal layers.

4. The method of claim 1 wherein the silicon containing dielectric layer is formed from a silicon containing dielectric material chosen from the group of silicon containing dielectric materials consisting of silicon oxide dielectric materials, silicon nitride dielectric materials, silicon oxynitride dielectric materials and composites of silicon oxide dielectric materials, silicon nitride dielectric materials and silicon oxynitride dielectric materials.

5. The method of claim 1 wherein the fluorine containing etchant gas is chosen from the group of fluorine containing etchant gases consisting of perfluorocarbons, hydrofluorocarbons, sulfur hexafluoride and nitrogen trifluoride.

6. The method of claim 1 wherein:
the first plasma reactor chamber pressure is greater than 0.1 torr; and
the second plasma reactor chamber pressure is no greater than 0.1 torr; and
the plasma reactor chamber is pumped at the second plasma reactor chamber pressure for a time period of greater than about 10 seconds.

7. The method of claim 1 wherein:
the plasma reactor chamber comprises a main plasma reactor chamber and an exit load lock of the main plasma reactor chamber; and
the first plasma reactor chamber pressure is maintained within the main plasma reactor chamber while the microelectronics fabrication is positioned within the main plasma reactor chamber; and
the second plasma reactor chamber pressure is maintained within the exit load lock of the main plasma reactor chamber while the microelectronics fabrication is positioned within the exit load lock of the main plasma reactor chamber.

8. A microelectronics fabrication having formed therein a silicon containing dielectric layer having a via formed therethrough in accord with the method of claim 1.

9. A plasma etch method for forming a via through a silicon containing dielectric layer within an integrated circuit microelectronics fabrication comprising:
providing a plasma reactor chamber;
positioning within the plasma reactor chamber an integrated circuit microelectronics fabrication, the integrated circuit microelectronics fabrication comprising:
a semiconductor substrate employed within the integrated circuit microelectronics fabrication;
a metal layer formed over the semiconductor substrate;
a silicon containing dielectric layer formed upon the metal layer; and
a patterned photoresist layer formed upon the silicon containing dielectric layer;

etching through use of a plasma etch method at a first plasma reactor chamber pressure while employing the patterned photoresist layer as a photoresist etch mask layer the silicon containing dielectric layer to form a via through the silicon containing dielectric layer while reaching and etching the metal layer to form an etched metal layer, the plasma etch method employing an etchant gas composition comprising a fluorine containing etchant gas; and pumping the plasma reactor chamber to a second plasma reactor chamber pressure lower than the first plasma reactor chamber pressure for a time sufficient to attenuate formation of a metal-fluoropolymer residue layer upon the etched metal layer.

10. The method of claim 9 wherein the metal layer is chosen from the group of metal layers consisting of aluminum containing metal layers, titanium containing metal layers and copper containing metal layers.

11. The method of claim 9 wherein the silicon containing dielectric layer is formed from a silicon containing dielectric material chosen from the group of silicon containing dielectric materials consisting of silicon oxide dielectric materials, silicon nitride dielectric materials, silicon oxynitride dielectric materials and composites of silicon oxide dielectric materials, silicon nitride dielectric materials and silicon oxynitride dielectric materials.

12. The method of claim 9 wherein the fluorine containing etchant gas is selected from the group of fluorine containing etchant gases consisting of perfluorocarbons, hydrofluorocarbons, sulfur hexafluoride and nitrogen trifluoride.

13. The method of claim 9 wherein:
the first plasma reactor chamber pressure is greater than 0.1 torr;
the second plasma reactor chamber pressure is no greater than 0.1 torr; and
the plasma reactor chamber is pumped at the second plasma reactor chamber pressure for a time period of greater than about 10 seconds.

14. The method of claim 9 wherein:
the plasma reactor chamber comprises a main plasma reactor chamber and an exit load lock of the main plasma reactor chamber; and
the first plasma reactor chamber pressure is maintained within the main plasma reactor chamber while the integrated circuit microelectronics fabrication is positioned within the main plasma reactor chamber; and
the second plasma reactor chamber pressure is maintained within the exit load lock of the main plasma reactor chamber while the integrated circuit microelectronics fabrication is positioned within the exit load lock of the main plasma reactor chamber.

15. An integrated circuit microelectronics fabrication having formed therein a silicon containing dielectric layer having formed therethrough a via in accord with the method of claim 9.

* * * * *